United States Patent
Biche et al.

[11] Patent Number: 5,427,820
[45] Date of Patent: Jun. 27, 1995

[54] THERMAL CONTROL LINE FOR DELIVERING LIQUID TO A POINT OF USE IN A PHOTOLITHOGRAPHY SYSTEM

[75] Inventors: Michael B. Biche, Union City; Vuong P. Nguyen, San Jose, both of Calif.

[73] Assignee: Semiconductor Systems, Inc., Fremont, Calif.

[21] Appl. No.: 92,728

[22] Filed: Jul. 16, 1993

[51] Int. Cl.⁶ .......................... B05B 3/12; B67D 5/62; B05C 13/02
[52] U.S. Cl. ...................................... 427/240; 118/52; 118/320; 222/146.6; 427/398.1; 427/398.3; 427/421
[58] Field of Search ............... 427/240, 398.1, 398.3, 427/421; 118/52, 320; 222/146.1

[56] References Cited

U.S. PATENT DOCUMENTS

| | | | |
|---|---|---|---|
| 4,171,064 | 10/1979 | Cornelius et al. | 222/146.6 |
| 4,190,015 | 2/1980 | Hillman | 427/240 |
| 4,561,486 | 12/1985 | Maedy et al. | 427/240 |
| 4,790,262 | 12/1988 | Nakayama et al. | 427/240 |
| 5,121,612 | 6/1992 | Guay et al. | 222/146.6 |
| 5,279,446 | 1/1994 | Cook et al. | 222/146.6 |
| 5,297,700 | 3/1994 | Burrows et al. | 222/146.6 |

Primary Examiner—Janyce Bell
Attorney, Agent, or Firm—Skjerven, Morrill, MacPherson, Franklin & Friel; O. K. Suryadevara

[57] ABSTRACT

An apparatus and method for dispensing liquid at a controlled temperature in a spin coating or developer machine are disclosed. The apparatus is a thermal control line that has an inner core wall that encloses at least one conduit for a liquid dispense line and an outer annular wall that encloses at least one chamber for circulation of coolant. The inner core wall and the outer annular wall are formed of such materials as to permit efficient heat exchange between the coolant and the liquid. The coolant is circulated in the annular chamber at a rate sufficient to maintain the dispensed liquid at a desired temperature.

14 Claims, 10 Drawing Sheets

THERMAL CONTROL LINE FOR DELIVERING LIQUID TO A POINT OF USE IN A PHOTOLITHOGRAPHY SYSTEM

FIELD OF THE INVENTION

This invention relates to photolithography systems and, in particular, a spin coating machine or a developer machine that has a thermal control line for providing thermally controlled dispensing of the liquid for coating or developing a semiconductor substrate.

BACKGROUND OF THE INVENTION

A photoresist mask is formed on a semiconductor substrate by first coating the substrate with a thin layer of photoresist, exposing the resist with the desired pattern, and then developing the photoresist layer. In the first step, the substrate is coated with photoresist by a spin coating machine. In the spin coating machine, a liquid that includes photoresist dissolved in a solvent is applied to the top surface of the substrate while the substrate is spun slowly. During this process, a solvent in the liquid evaporates, causing the photoresist to solidify. The liquid is applied via a liquid dispense line. Ordinarily when the liquid is dispensed, there is no thermal control as it passes through the dispense line. Applicants have found that this lack of thermal control results in non-uniform coatings. Therefore, Applicants have found it necessary for liquids dispensed in a spin coating machine to be temperature controlled. Similarly, Applicants have also found it necessary for liquids dispensed in a developer machine to be temperature controlled.

FIG. 1 illustrates an exploded view of the spin coating machine which has been in use by the industry for a number of years. Spin coating machine 100 is illustrated schematically as containing a liquid dispense line 120 that dispenses liquid from a nozzle assembly (point of use) 104C on a substrate 103. Substrate 103 is supported by a flat vacuum chuck 102 connected to a spin motor 101.

Spin coating machine 100 has an exhaust system that includes a liquid drain line 105, an air purge line 106 and a safety line 107. Lines 105 and 106 connect to a coating chamber 100A and line 107 connects to a motor chamber 100B of spin coating machine 100. Lines 105 and 106 lead to a drain tank 109, which is used to collect excess liquid. Line 107 leads to an exhaust manifold 110, which is connected to the factory exhaust system. A connecting line 111 allows vapor from drain tank 109 to enter exhaust manifold 110.

As each substrate is processed, in order to prevent the liquid from drying too quickly, a selected concentration of vapor is maintained in the atmosphere in coating chamber 100A. This may be done advantageously with the arrangement described in commonly-owned co-pending application Ser. No. 07/904,795, U.S. Pat. No. 5,289,222 filed Jun. 26, 1992, which is incorporated by reference herein in its entirety. During the spin coating process, programmable exhaust unit 112 closes a butterfly valve (not shown) in conduit 111 so as to restrict the flow of air and vapor from drain tank 109 to exhaust manifold 110. This in turn limits the flow of vapor and air in lines 105 and 106 and maintains the vapor concentration in coating chamber 100A at an increased level. When the coating process is completed, programmable exhaust unit 112 opens the butterfly valve and the normal flow of the vapors and air through lines 105 and 106 into the factory exhaust system is reestablished.

Applicants have found several disadvantages with the prior art apparatus and method. The main disadvantage of the prior art apparatus and method is that the temperature of the liquid dispensed over the top of the substrate is uncontrolled. Therefore, variations in the temperature of the surroundings may lead to non-uniform coatings even though a selected vapor concentration is maintained by use of the butterfly valve.

Some prior art systems may control the temperature of a liquid dispense line to a limited extent. Even in such prior art systems, there is no temperature control at the liquid exit end (point of use) of the liquid dispense line and for a significant distance (several feet) upstream from the liquid exit end. The lack of temperature control over this distance results in a change in temperature of the liquid. This problem becomes especially acute if the liquid is not continuously dispensed. For example, if liquid dispensing is suspended over-night, temperature of the liquid around the liquid exit end cannot be controlled when the system is started up again.

Also, in some prior art systems that provide cooling of the dispense liquid, the coolant is circulated in a jacket around a single liquid dispense line. Since mechanical fittings are used to mount the jacket on to the liquid dispense line, such prior art fittings occasionally leak and coolant is discharged. Even though the jacket terminates at a significant distance upstream from the liquid exit end (point of use), any coolant discharge from the jacket may result in damage to the substrate or to other machinery in the system.

Finally, prior art devices used to cool the dispense liquid are generally of a size sufficiently large to block air flow to the substrate and around the substrate. Such improper blockage of air flow leads to non-uniform coatings.

SUMMARY OF THE INVENTION

It is an object of the invention to dispense liquid in a thermally controlled manner in a spin coating machine. Ordinarily when the liquid is dispensed, there is no thermal control and this lack of thermal control results in non-uniform coatings.

In an apparatus and method according to this invention, a thermal control line has an inner core wall that encloses a conduit for a liquid dispense line and an outer annular wall that encloses a chamber for circulation of coolant. The inner core wall and the outer annular wall are formed of a material that permits efficient heat exchange between the coolant and the liquid.

In one embodiment, the thermal control line has an inner core wall that encloses three conduits that contain three liquid dispense lines. Also, the outer annular wall encloses two chambers, a first chamber and a second chamber disposed opposite and adjacent the first chamber. The coolant initially enters the first chamber of the thermal control line and flows toward the liquid exit end. The coolant returns back from the liquid exit end in the second chamber. The coolant is circulated at a rate sufficient to maintain the dispensed liquid at a desired temperature.

DESCRIPTION OF THE INVENTION

Figure 1:
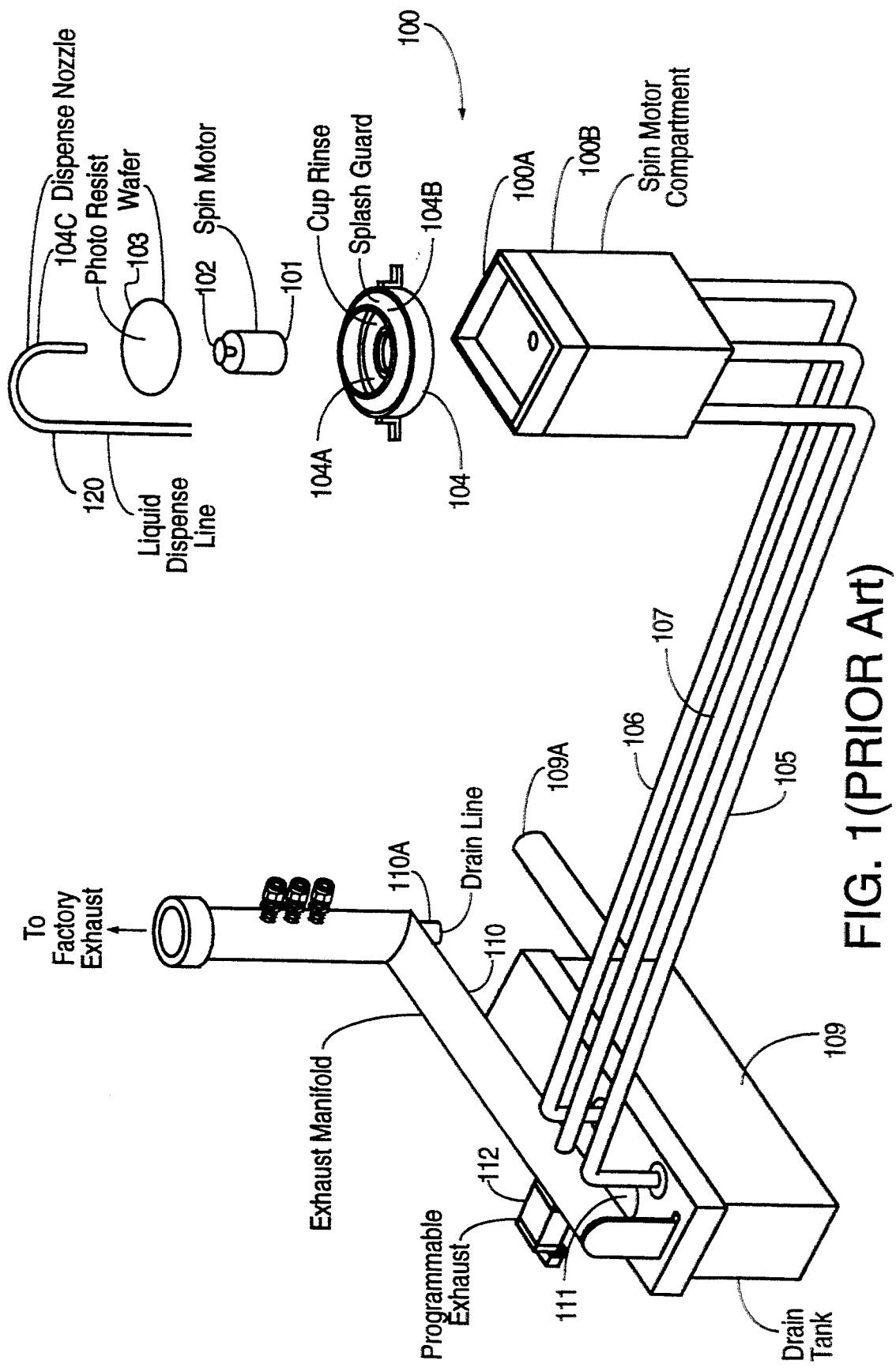
FIG. 1 illustrates an exploded view of a prior art spin coating machine.
Figure 2:
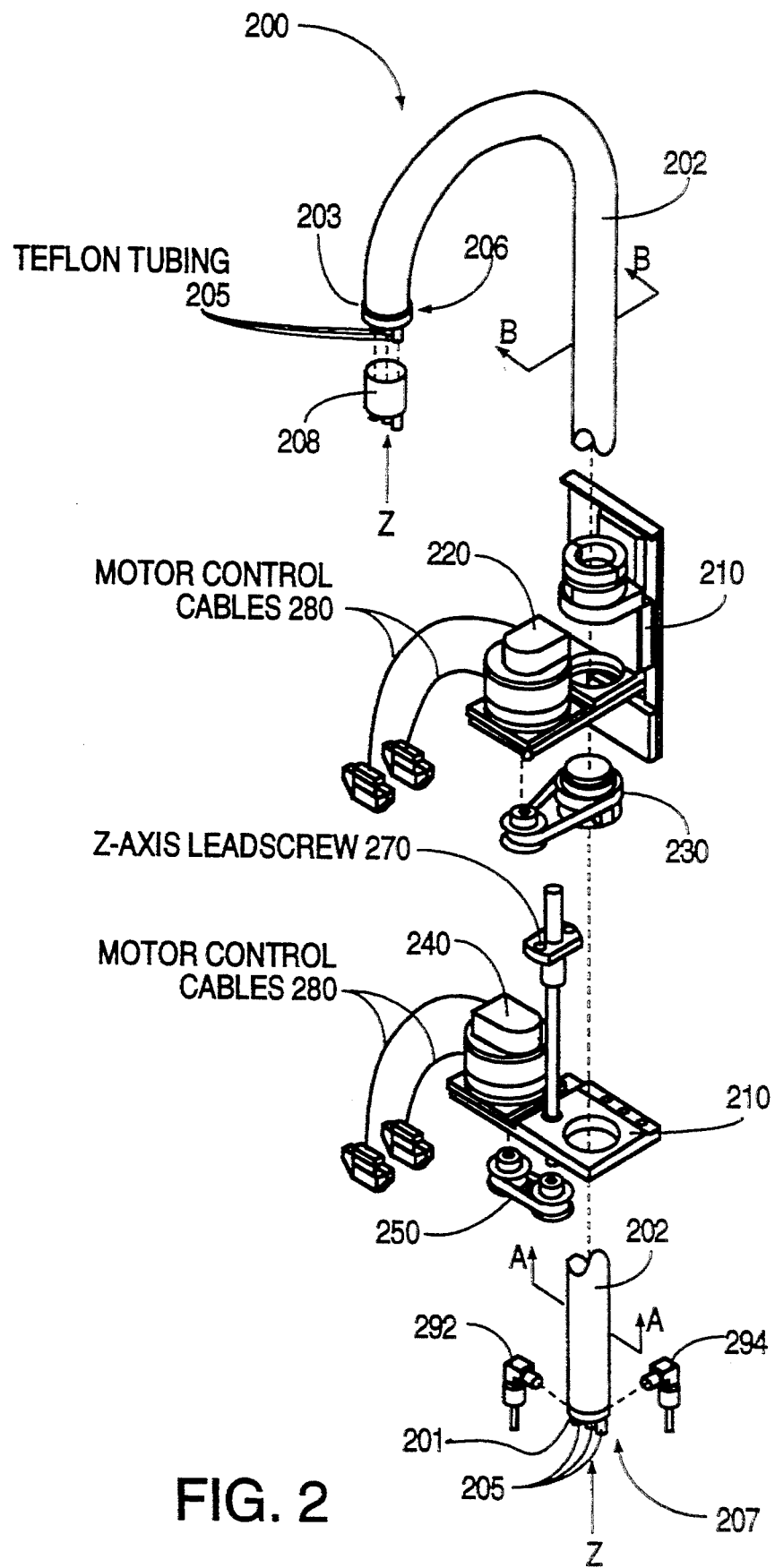
FIG. 2 illustrates an exploded view of one embodiment of a thermal control line in accordance with this invention.

FIG. 2 illustrates an exploded view of one embodiment of a thermal control line in accordance with this invention. As shown in FIG. 2, thermal control line 200 includes an extrusion 202 that has at its two ends a liquid entry cap 201, and a liquid exit cap 203. Liquid entry cap 201 and liquid exit cap 203 are machined aluminum parts while extrusion 202 is an aluminum extrusion. Caps 201 and 203 are welded on to extrusion 202 to form thermal control line 200.

Also shown in FIG. 2 are three Teflon TM tubes 205 that supply the liquids used to coat the substrate. Tubes 205 run inside thermal control line 200 between liquid exit end 206 (point of use) and liquid entry end 207. At liquid exit end 206, a nozzle assembly 208 may be optionally used to discharge the liquids on to the substrate.

Thermal control line 200 is mounted in the spin coating machine via mountings 210. Thermal control line 200 may be rotated about the Z axis by belt and pulley mechanism 230 which is driven by motor 220. Also, thermal control line 200 may be translated in the Z direction by lead screw 270 which is driven by motor 240. Motors 220 and 240 are controlled via motor control cables 280 by a microcontroller (not shown). Coolant is supplied to thermal control line 200 by coolant supply line 292 and is taken away by coolant drain line 294.

Figure 3A:
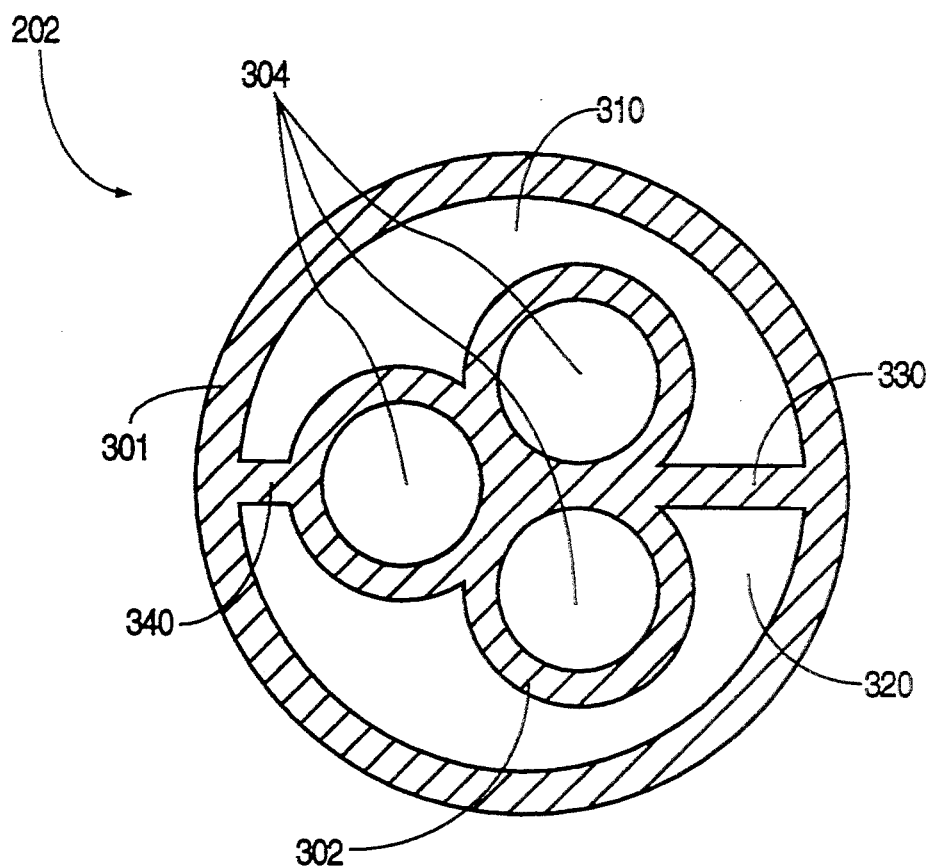
FIG. 3A illustrates a cross-sectional view of the extrusion of the thermal control line taken from direction A—A shown in FIG. 2.

FIG. 3A illustrates a cross-sectional view of extrusion 202 of thermal control line 200 taken at section A—A shown in FIG. 2. Extrusion 202 includes an outer annular wall 301, an inner core wall 302 that encloses conduits 304 and radial walls 330 and 340. As shown in FIG. 3A, the space between outer annular wall 301 and inner core wall 302 is divided by radial walls 330 and 340. Therefore radial walls 330 and 340 together with annular wall 301 and inner core wall 302 form chambers 310 and 320. Chambers 310 and 320 are used for circulation of the coolant. Circulation of the coolant maintains the temperature of the liquids in Teflon TM tubes 205 (visible in FIG. 2) at the desired level.

Although in this embodiment, inner core wall 302 is formed to enclose three inner conduits 304 to accommodate three Teflon TM tubes 205, any number of conduits 304 may be formed by inner core wall 302 in accordance with this invention.

Figure 3B:
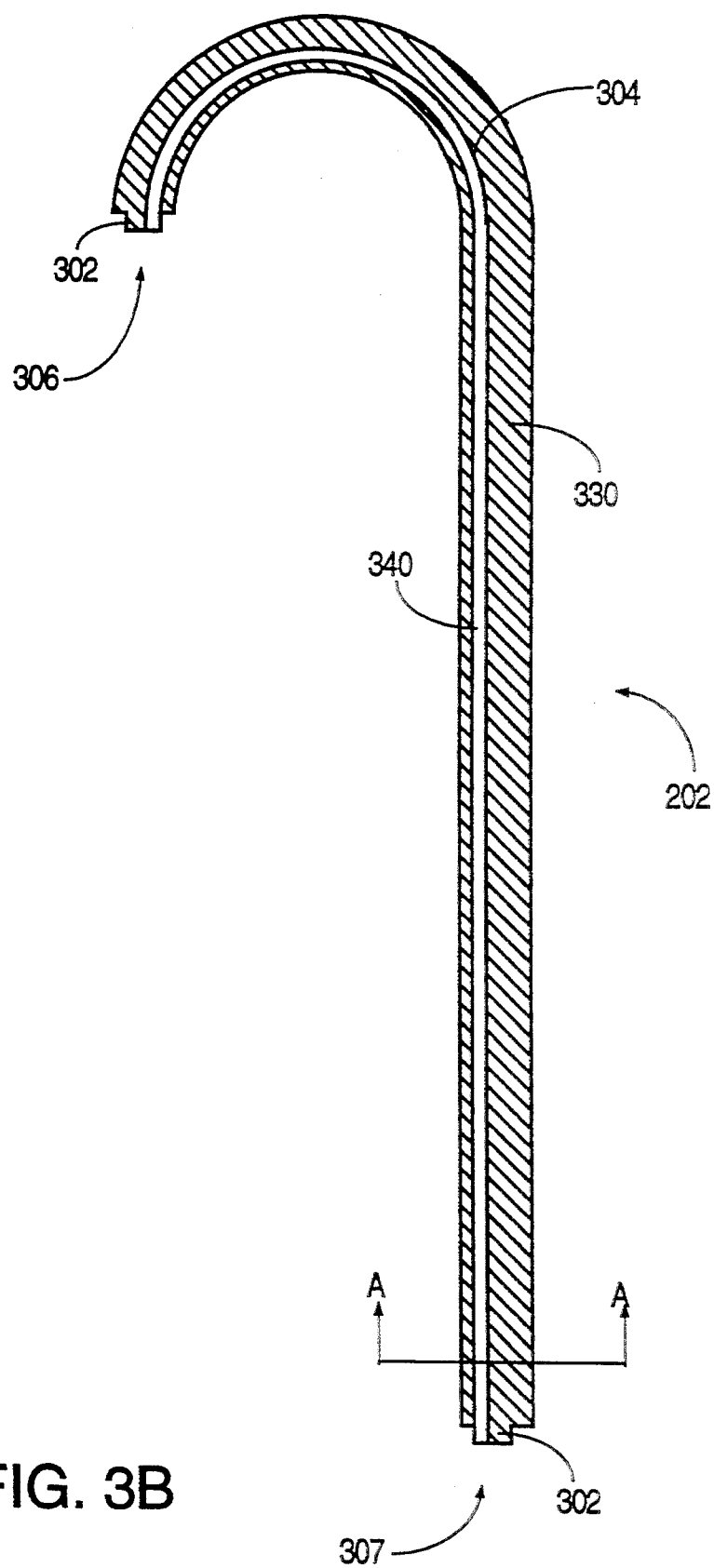
FIG. 3B illustrates a cross-sectional view of the extrusion taken from direction B—B shown in FIG. 2.
Figure 3C:
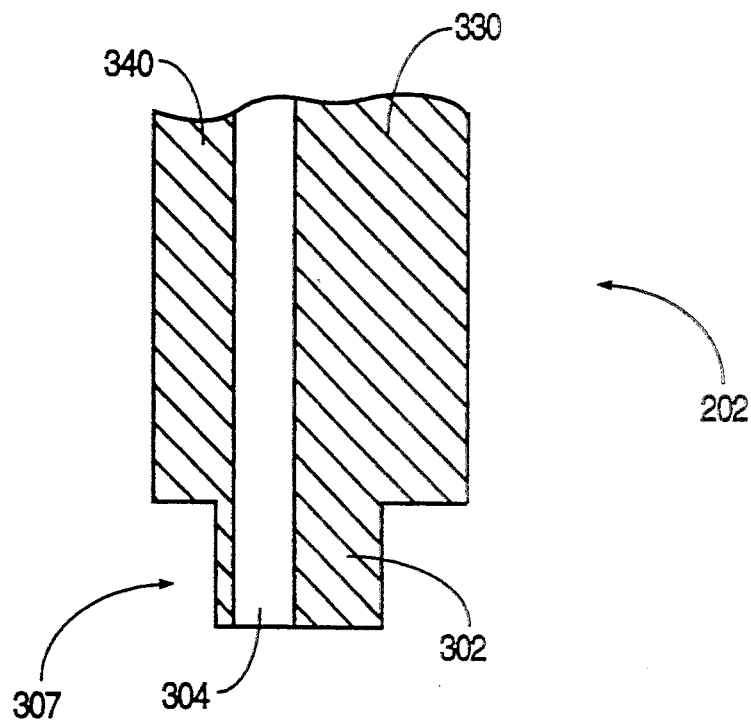
FIG. 3C illustrates a cross-sectional view of the liquid entry end of the extrusion.
Figure 3D:
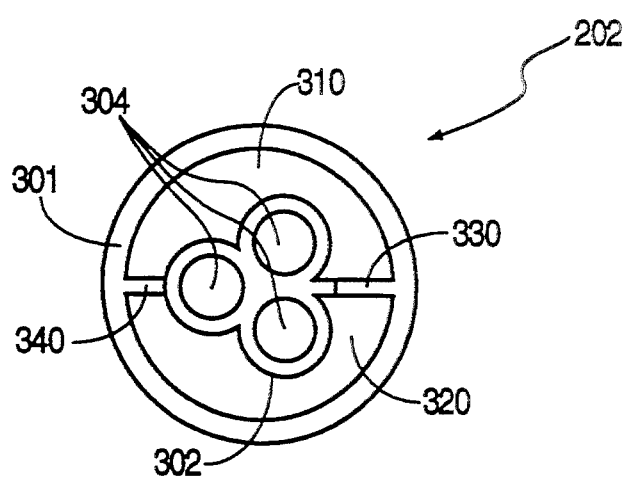
FIG. 3D illustrates a view of the liquid entry end of the extrusion as viewed in the Z direction shown in FIG. 2.

FIG. 3B illustrates a cross-sectional view of extrusion 202 taken at section B—B shown in FIG. 2. As shown in FIG. 3B, inner core wall 302 protrudes beyond annular wall 301 at liquid exit end 306 as well as at liquid entry end 307. The protrusions at the two ends are formed by machining away outer annular wall 301 and sidewalls 330 and 340 at the two ends of extrusion 202. FIG. 3C illustrates a detailed cross-sectional view of liquid entry end 307 of extrusion 202. FIG. 3D illustrates a view of the liquid entry end of extrusion 202 as viewed in the Z direction shown in FIG. 2.

Figure 3E:
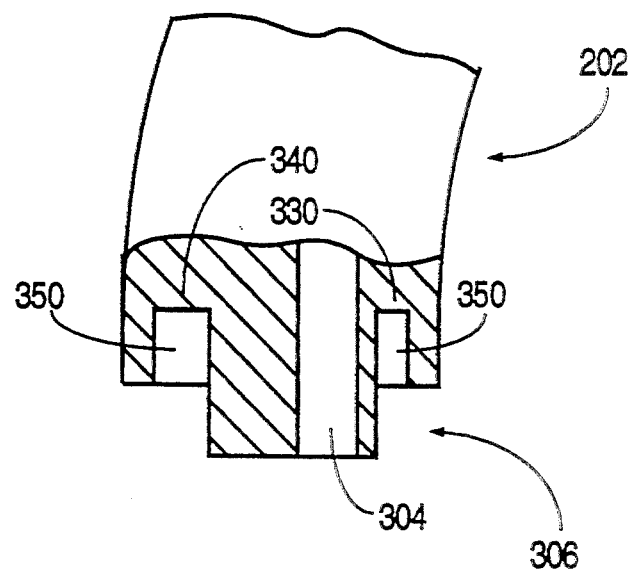
FIG. 3E illustrates a break-away view of the liquid exit end of the extrusion.
Figure 3F:
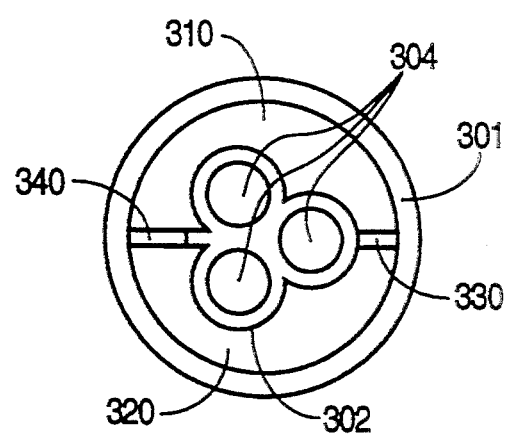
FIG. 3F illustrates a view of the liquid exit end of the extrusion as viewed in the Z direction shown in FIG. 2.

FIG. 3E illustrates a break-away view of the liquid exit end of extrusion 202. As seen in FIG. 3E, openings 350 are formed in walls 330 and 340 in the protruding part of extrusion 202 at liquid exit end 306 by machining walls 330 and 340. FIG. 3F illustrates a view of the liquid exit end of extrusion 202 as viewed in the Z direction shown in FIG. 2.

Figure 4A:
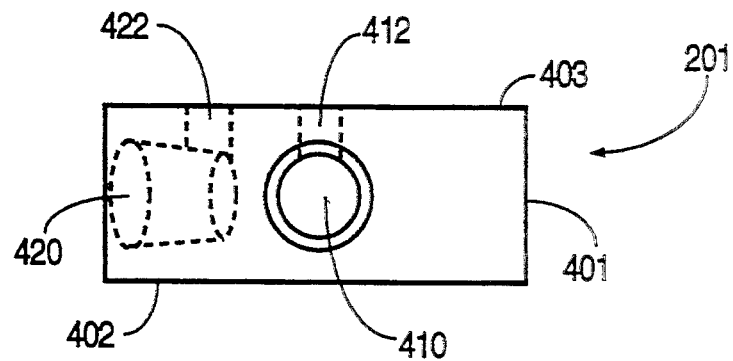
FIG. 4A illustrates a side view of the liquid entry cap of the thermal control line.
Figure 4B:
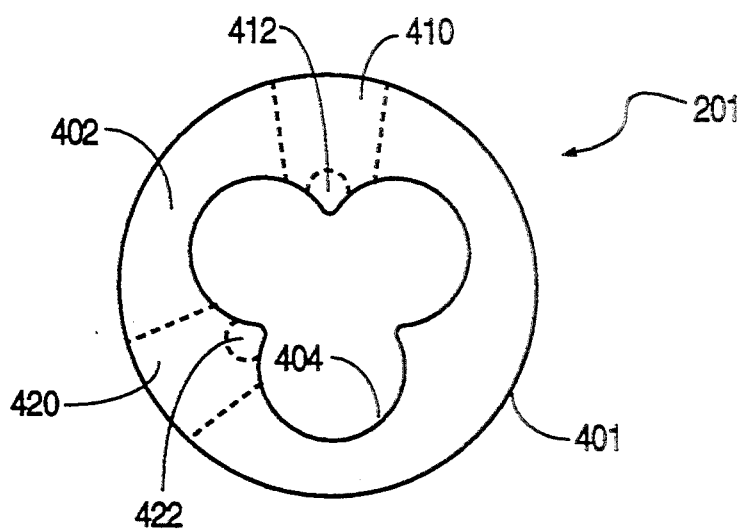
FIG. 4B illustrates the liquid entry cap as viewed in the Z direction of FIG. 2.

FIG. 4A illustrates a side view of liquid entry cap 201 of the thermal control line. FIG. 4B illustrates liquid entry cap 201 as viewed in the Z direction of FIG. 2. Liquid entry cap 201 is machined from a solid cylindrical block of aluminum. As shown in FIGS. 4A and 4B, liquid entry cap 201 has a cylindrical wall 401, two planar walls 402 and 403 and an inner core wall 404. Cylindrical wall 401 has two pipe-thread shaped radial holes 410 and 420 formed at an angle of 120° with respect to each other. Also, planar wall 403 has two holes 412 and 422 drilled at right angles to, and communicating with holes 410 and 420, respectively.

Figure 4C:
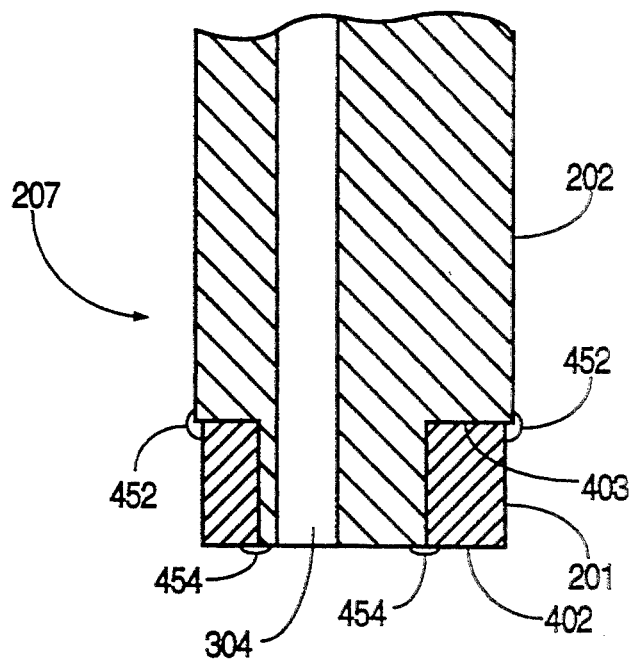
FIG. 4C illustrates a cross-sectional view of the assembly at the liquid entry end of the thermal control line.
Figure 4D:
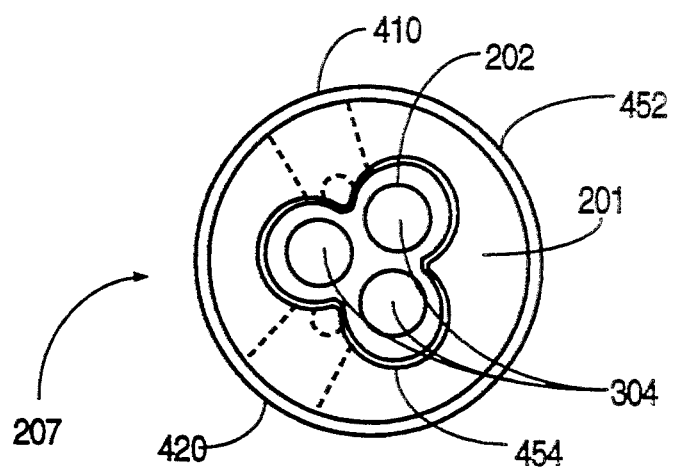
FIG. 4D illustrates the assembly at the liquid entry end as viewed in the Z direction of FIG. 2.

Liquid entry cap 201 has sufficient dimensions so that it may be assembled on to extrusion 202 at the liquid entry end. FIG. 4C illustrates a cross-sectional view of the assembly at liquid entry end 207 of thermal control line 200. FIG. 4D illustrates liquid entry end 207 as viewed in the Z direction of FIG. 2. As seen in FIGS. 4C and 4D, the assembly at liquid entry end 207 is formed by assembling liquid entry cap 201 on to extrusion 202. The assembly is made in such a manner that planar wall 403 of cap 201 faces extrusion 202 so that holes 412 and 422 of cap 201 (FIG. 4A) communicate with chambers 310 and 320 of extrusion 202 (FIG. 3D). Welds at 452 and 454 are used to seal the assembly in a leak-proof manner.

Figure 5A:
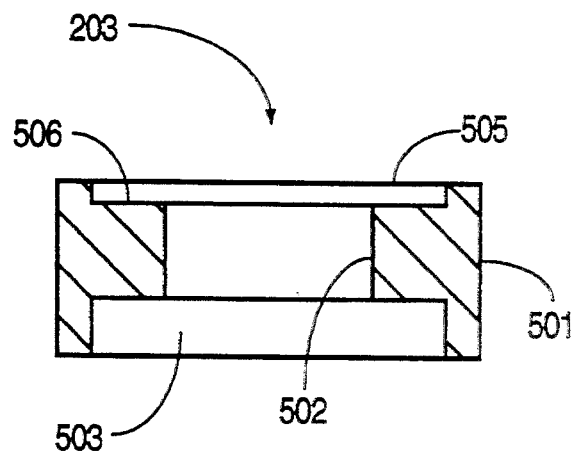
FIG. 5A illustrates a cross-sectional view of the liquid exit cap of the thermal control line.
Figure 5B:
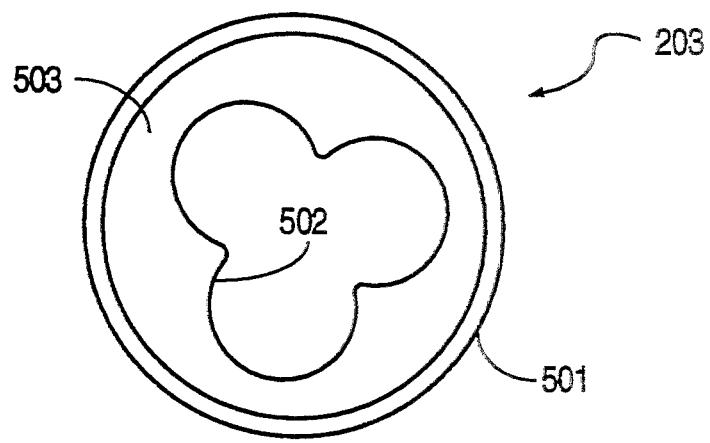
FIG. 5B illustrates the liquid exit cap as viewed in the Z direction of FIG. 2.

FIG. 5A illustrates a cross-sectional view of liquid exit cap 203 of the thermal control line. FIG. 5B illustrates liquid exit cap 203 as viewed in the Z direction of FIG. 2. Liquid exit cap 203 is machined from a solid cylindrical block of aluminum. As seen in FIGS. 5A and 5B, liquid exit cap 203 has a cylindrical wall 501 an inner core wall 502 and two recesses 503 and 505.

Figure 5C:
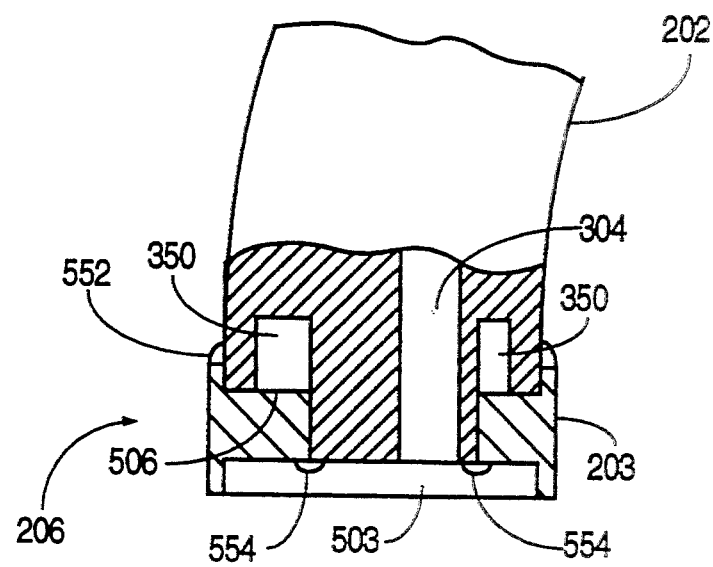
FIG. 5C illustrates a cross-sectional view of the assembly at the liquid exit end of the thermal control line.
Figure 5D:
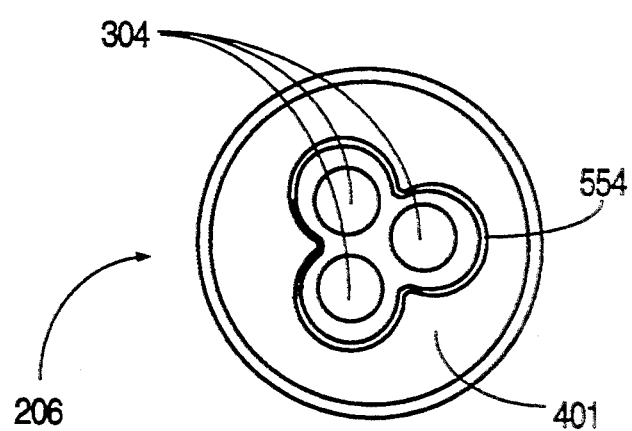
FIG. 5D illustrates a view of the assembly at the liquid exit end as viewed in the Z direction shown in FIG. 2.

Liquid exit cap 203 has sufficient dimensions so that it may be assembled on to extrusion 202 at the liquid exit end. FIG. 5C illustrates a cross-sectional view of liquid exit end 206 of the thermal control line 200 taken from direction B—B shown in FIG. 2. FIG. 5D illustrates a view of liquid exit end 206 of the thermal control line as viewed in the Z direction shown in FIG. 2. As shown in FIGS. 5C and 5D, liquid exit end 206 is formed by assembling liquid exit cap 203 on to extrusion 202. The assembly is made in such a manner that planar wall 506 of cap 203 faces chambers 310 and 320 and openings 350 of extrusion 202. Welds at 552 and 554 are used to seal the assembly in a leak-proof manner. Conduits 304 are left accessible at liquid exit end 206.

Once the thermal control line has been formed by welding caps 201 and 203 to extrusion 202 as described above, the only access to chambers 310 and 320 (FIG. 3F) at liquid entry end 207 is via holes 410 and 420 in cap 201. There is no access to chambers 310 and 320 at liquid exit end 206. However at liquid exit end 206, openings 350 in walls 330 and 340 of extrusion 202 allow the coolant to flow from chamber 310 into chamber 320. Conduits 304 of extrusion 202 are left accessible to the outside world at both liquid entry end 207 and liquid exit end 206. Three Teflon TM tubes 205 are run through conduits 304 between liquid exit end 206 and liquid entry end 207 as described above in reference to FIG. 2. During operation, the liquids to be dispensed flow from liquid entry end 207 to liquid exit end 206 inside Teflon TM tubes 205.

The coolant enters the thermal control line from coolant supply line 294 (FIG. 2) via holes 410 and 412 of liquid entry cap 201 (FIGS. 4A and 4B). Inside the thermal control line, the coolant flows in chamber 310 (FIG. 3A) adjacent inner core wall 302 (FIG. 3A) of extrusion 202. The coolant continues to flow in chamber 310 from liquid entry end 207 up to liquid exit end 206 (FIG. 2). At liquid exit end 205, the coolant flows from chamber 310 into chamber 320 via openings 350 (FIG. 5C). The coolant then flows in the opposite direction in chamber 320 adjacent inner core wall 302 (FIG. 3A) of extrusion 202 up to liquid entry end 207. At liquid entry end 207, the coolant is taken away by coolant drain line 292 via holes 422 and 420 in liquid entry cap 201 (FIGS. 4A and 4B). Therefore while passing through the thermal control line, the liquids in tubes 205 are cooled by the coolant circulating in chambers 310 and 320.

Coolant flows through thermal control line 200 at a rate sufficient to maintain the liquid in Teflon TM tubes 205 at a desired temperature. Although in the preferred embodiment a coolant is circulated, in other embodiments, a heat exchange fluid at a higher temperature may be circulated if it is necessary to heat the liquid in Teflon TM tubes 205.

Circulation of a coolant ensures that the liquid to be dispensed on a semiconductor substrate is maintained at a desired temperature prior to being dispensed. Thus local variations in the temperature of the environment surrounding the thermal control line have minimal effect on the temperature of the liquid to be dispensed. Thermal control of the liquid being dispensed ensures consistent and uniform coatings of the liquid on the semiconductor substrate. In the preferred embodiment the liquid being dispensed includes photoresist and a solvent.

In accordance with this invention, the walls of thermal control line 200 are formed of a material which permits efficient heat exchange between the liquids inside Teflon TM tubes 205 that run through conduits 304 and the coolant inside chambers 310 and 320. In the preferred embodiment, extrusion 202, caps 201 and 203 are formed of aluminum to achieve a high thermal exchange efficiency. In the preferred embodiment, the aluminum is a standard grade aluminum generally used for forming aluminum extrusions.

A thermal control line in accordance with the above description has several advantages. A single extrusion results in efficient heat transfer between the coolant and the liquid. The radial walls 330 and 340 of extrusion 202 are positioned as shown in FIG. 3A for ease of manufacture of the extrusion. However, the radial walls may be formed at a different orientation to improve heat exchange efficiency in accordance with this invention. Also, a single extrusion for circulation of coolant as well as for supporting Teflon TM tubes results in low manufacturing costs.

Applicants have found that with the thermal control line, even if temperature of the surroundings was varied, uniform coatings are achieved since temperature of the liquid is controlled up to the liquid exit end (which is the point of use). Thus the substrates are coated with liquid at a single uniform temperature irrespective of the temperature of the surrounding environment.

Also, since the coolant is circulated in an annular tube that is completely welded at the liquid exit end, there is no possibility of leakage of coolant. Thus damage to the substrate due to coolant discharge is impossible.

Finally, the thermal control line is of a size sufficiently small so that there is minimal interference with air flow to the substrate and around the substrate. This results in uniform coatings of the substrate. Also, in the embodiment disclosed above, three conduits are formed within the inner core wall so that three different liquids may be cooled simultaneously by a single coolant. This again results in a compact system and therefore uniform coatings.

While in the embodiments illustrated in FIGS. 2–5D, a simple heat exchange structure has been shown, it will be apparent to those skilled in the art that the thermal control line may assume a variety of shapes and sizes and still perform its claimed function. For example, fins may be provided on the inner central wall to enhance heat transfer. Moreover, the coolant circulation chambers need not be formed as parts of an annular chamber at all. For example, a coolant circulation line may be formed as a double helical spiral wrapped around the liquid dispense lines. Therefore modifications to the figures or descriptions of the above embodiments do not depart from the spirit of the invention and are deemed to be within the scope of the invention which is to be limited only by the appended claims.

We claim:

1. An apparatus for delivering a liquid to a point of use adjacent to a substrate in a photolithography system, said apparatus comprising a liquid supply tube, a coolant supply line and a thermal control line, said thermal control line comprising:
   an inner core wall that encloses at least one conduit for transfer of liquid; and
   an outer tubular wall that encloses said inner core wall and at least one chamber, said chamber being between said outer tubular wall and said inner core wall, said chamber being for circulation of coolant,
   wherein said conduit is connected to said liquid supply tube and said chamber is connected to said coolant supply line.

2. The apparatus of claim 1 wherein said chamber is substantially co-extensive with said conduit.

3. The apparatus of claim 1 wherein said inner core wall is formed of such material as to permit efficient heat exchange between said coolant and said liquid.

4. The apparatus of claim 1 wherein
(i) said thermal control line has a liquid entry end and a liquid exit end opposite said liquid entry end, and
(ii) said coolant enters said thermal control line at said liquid entry end, and said coolant exits said thermal control line at said liquid entry end.

5. The apparatus of claim 4 wherein said outer tubular wall encloses a first chamber and a second chamber disposed opposite and adjacent said first chamber.

6. The apparatus of claim 5 wherein said coolant flows toward said liquid exit end in said first chamber and from said liquid exit end in said second chamber, and between said first chamber and said second chamber at said liquid exit end.

7. The apparatus of claim 1 wherein said liquid supply tube is formed of a material suitable for transferring a solvent for photoresist.

8. The apparatus of claim 1 wherein said liquid supply tube is formed of a material suitable for transferring a solvent for developer.

9. The apparatus of claim 1 further comprising a tube residing in said conduit, said tube transferring said liquid.

10. The apparatus of claim 1 wherein said inner core wall encloses three conduits.

11. A method for dispensing liquid at a temperature in a photolithography system using a liquid dispense line in a spin coating machine, said method comprising the steps of:
surrounding said liquid dispense line by at least one coolant circulation chamber; and
circulating coolant through said coolant circulation chamber at a rate sufficient to maintain the dispensed liquid at said temperature.

12. The method of claim 11 wherein prior to said circulation step, the temperature of said coolant is lower than said temperature.

13. A photolithography system comprising:
(i) a thermal control line for delivering a liquid to a point of use adjacent to a substrate, said line comprising an inner core wall that encloses at least one conduit for transfer of liquid and an outer annular wall that encloses at least one chamber for circulation of coolant;
(ii) a liquid supply tube connected to said conduit;
(iii) a coolant supply line connected said chamber; and
(iv) a flat vacuum chuck connected to a motor for supporting said substrate.

14. The system of claim 13 further comprising a nozzle assembly for dispensing said liquid onto said substrate, said nozzle assembly being mounted on said thermal control line at said point of use.

* * * * *

UNITED STATES PATENT AND TRADEMARK OFFICE
CERTIFICATE OF CORRECTION

PATENT NO.    :    5,427,820
DATED         :    June 27, 1995
INVENTOR(S)   :    Biche et al.

It is certified that error appears in the above-identified patent and that said Letters Patent is hereby corrected as shown below:

On cover page of Patent, change "[75] Inventors: Michael B. Biche" to --[75] Inventors:  Michael R. Biche--

Signed and Sealed this

Seventh Day of November, 1995

Attest:

Attesting Officer

BRUCE LEHMAN

Commissioner of Patents and Trademarks